(12) United States Patent
Shin et al.

(10) Patent No.: US 6,275,374 B1
(45) Date of Patent: Aug. 14, 2001

(54) ELECTRONIC DEVICE EQUIPPED WITH SPACER WHICH SERVES TO PROTECT ELECTRONIC COMPONENTS

(75) Inventors: Takahiro Shin; Masahiko Sato, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/455,023

(22) Filed: Dec. 6, 1999

(30) Foreign Application Priority Data

Jan. 25, 1999 (JP) .................................................. 11-015757

(51) Int. Cl.[7] ..................................................... H05K 7/20
(52) U.S. Cl. .......................... 361/680; 361/687; 361/704; 361/758; 361/810
(58) Field of Search .......................... 174/16.3; 165/80.3, 165/185; 361/680, 687, 704, 708, 709–710, 742, 758, 804, 807, 809–810

(56) References Cited

U.S. PATENT DOCUMENTS

| | | | |
|---|---|---|---|
| 5,355,278 | * 10/1994 | Hosoi et al. | 361/680 |
| 5,608,611 | * 3/1997 | Szudarek et al. | 361/753 |
| 5,706,180 | * 1/1998 | Lacroix et al. | 361/807 |

FOREIGN PATENT DOCUMENTS

| | | |
|---|---|---|
| 4-273198 | 9/1992 | (JP) . |
| 5-131788 | 5/1993 | (JP) . |
| 5-57893 | 7/1993 | (JP) . |
| 5-243434 | 9/1993 | (JP) . |
| 5-82093 | 11/1993 | (JP) . |
| 8-8567 | 1/1996 | (JP) . |
| 10-229287 | 8/1998 | (JP) . |

* cited by examiner

Primary Examiner—Gregory Thompson
(74) Attorney, Agent, or Firm—Staas & Halsey LLP

(57) ABSTRACT

An electronic device that protects an electronic component on a motherboard from vibration and impact. The device includes a spacer around the electronic component, and connected with rigid members on both sides of the board.

13 Claims, 2 Drawing Sheets

ELECTRONIC DEVICE EQUIPPED WITH SPACER WHICH SERVES TO PROTECT ELECTRONIC COMPONENTS

BACKGROUND OF THE INVENTION

The present invention relates generally to electronic devices such as information processing equipment, and more particularly to an electronic device that has a mechanism for protecting electronic components. The present invention is suitable, for example, for protection of an LSI mounted on a motherboard in a notebook personal computer ("PC").

Notebook PCs are required to efficiently radiate the heat generated from high-performance electronic components. They are also required to have a rigid body housing in order to protect electronic components such as a CPU from an impact and torsion that are applied to the body.

Accordingly, a conventional notebook PC has enhanced rigidity using a thick body housing, and is provided with a heat-radiative plate in contact with or in the neighborhood of the electronic components. A motherboard mounted with these electronic components is fixed on the housing's bottom surface through a spacer, and spaced from the surface by a predetermined distance. Accordingly, the electronic components are supposed to be protected from contacting and/or colliding with top and bottom surfaces of the housing even when the housing bends. A plurality of spacers is generally mounted around the motherboard (or printed circuit board) to allow installation of the electronic components on the motherboard. The conventional electronic component has not contacted the housing's top and bottom surfaces, because the maximum flexure amount of the bent housing was smaller than the distance between the electronic component and the housing.

However, the more recent thin-body boom that the notebook PCs are inevitably required to seek has thinned the housing width (in a height direction) and shortened the spacer length. In addition, the aspect ratio in the housing is not so different from the conventional one because the longitudinal and lateral lengths of the housing should match a size of a display to be mounted thereon. As a result, the electronic components mounted on the motherboard have become closer to the housing's top and bottom surfaces, beyond the housing's flexure amount, and the electronic components have come into contact and/or collide with the housing's top and/or bottom surfaces directly or through the radiative plate, often getting damaged.

For example, a conventional structure shown in FIG. 3, that fixes motherboard 202 on bottom surface 214 of the housing 210 through spacer 208 would cause electronic components 204 mounted on the front side of the motherboard 202 itself through the electronic components 204. Then, the electronic components 206 mounted on the rear side of the motherboard 202 come into contact and/or collide with the bottom surface 214 of the housing 210, often getting damaged. These problems would possibly occur when the housing 210 is twisted.

In addition, the conventional structure show in FIG. 3 cannot remove the vibration external to the housing, and the vibration often damages the electronic components. Such vibration frequency occurs especially in the PC having a keyboard. The conventional structure that provides a radiative plate between a motherboard and housing's top surface prevents the housing from becoming thinner and lighter due to the thickness and weight of the radiative plate.

SUMMARY OF THE INVENTION

Therefore, it is an exemplified general object of the present invention to provide a novel and useful electronic device in which the above disadvantages are eliminated.

Another exemplified and more specific object of the present invention is to provide an electronic device that may appropriately protect electronic components from vibration and impact.

Still another and exemplified object of the present invention is to provide an electronic device that may facilitate a slimmer and/or lighter body housing, while properly radiating heat from the electronic component.

In order to achieve the above objects, an electronic device of one aspect of the present invention includes an electronic component, a board mounted with the electronic component, and a rigid member connected to the spacer at both sides of the board. As the electronic device of the present invention provides the spacer near the electronic component and connects it to the rigid member, a flexure amount of the rigid member may become less than having a spacer around the board. For example, as shown in FIG. 3 where the spacer exists between the rear side of the board and the bottom rigid member, the pressure applied to the top rigid member would bend the board, and any electronic component located at the rear side of the board. As a result, the electronic component at the rear side of the board would collide with the bottom rigid member and could be changed. The present invention uses the spacer to prevent the board from bending and the electronic component at the rear side of the board from colliding with the bottom rigid member. Preferably, the spacers are arranged almost symmetrically with respect to the board. The rigid member may be made of a pair of different rigid members, or may be one rigid member such that it includes top and bottom surfaces of the housing.

The spacer may include one or more members. The spacer composed of one member would penetrate the board near the electronic component. Such a spacer might, for example, have a doughnut shape surrounding the electronic component. The spacer composed of multiple members might use two spacer, each of which has the above doughnut shape arranged almost symmetrically with respect to the board, or has a cylindrical or polygonal column shape arranged at both sides of the board near the electronic component. Naturally, a shape of the spacer at one surface and that on the other surface need not be the same. The spacer, if made heat conductive, would transmit to the rigid member the heat generated by the electronic component.

Preferably, the rigid member is a radiative plate to provide heat radiation for the electronic component. Moreover, the rigid member, if configured as a housing that contains the electronic component, board and spacer, would result in a thinner and lighter housing than that having the rigid member and the housing independently. The spacer that enhances the housing's rigidity eliminates a necessity of increasing the housing's rigidity using the thick housing and thus would facilitate the thin and light housing. No additional member is required as a result of making the electronic device as a notebook PC and the rigid member as a radiative plate for its keyboard.

A shock absorber, if provided between the spacer and rigid member and/or between the spacer and board, would enable the vibration that was applied to the rigid member to be absorbed and prevent the heat transmission to the electronic component. The heat-conductive member, if provided between the electronic component and rigid member, would efficiently radiate the heat from the electronic component through the rigid member. The heat-conductive, member if serving as a shock absorber, would absorb the vibration applied to the rigid member, preventing the heat transmission to the electronic component.

An electronic device of another aspect of the present invention includes an electronic component which generates heat, a board mounted with the electronic component, a spacer located at both sides of the board near the electronic component, and a housing connected to the spacer and storing the electronic component, the board and the spacer. The spacer thus placed relative to the electronic component that is a heat source, such as an LSI, would enhance the housing's rigidity around the electronic component, and the housing may serve to radiate the heat as conducted by the conventionally required radiative plate.

An apparatus of another aspect of the present invention includes a component, a board mounted with the component, a spacer located on the board near the component, and a rigid member connected to the spacer. The apparatus of the present invention is not limited to the electronic device, and the component may be an electric, electronic, magnetic, or optical element, or a combination thereof. The apparatus is applicable to all components that are relatively weak upon impact, etc., and low in strength.

Other objects and further features of the present invention will become readily apparent from the following description of the embodiments with reference to accompanying drawings.

DETAILED DESCRIPTION OF PREFERRED EMBODIMENTS

Figure 1:
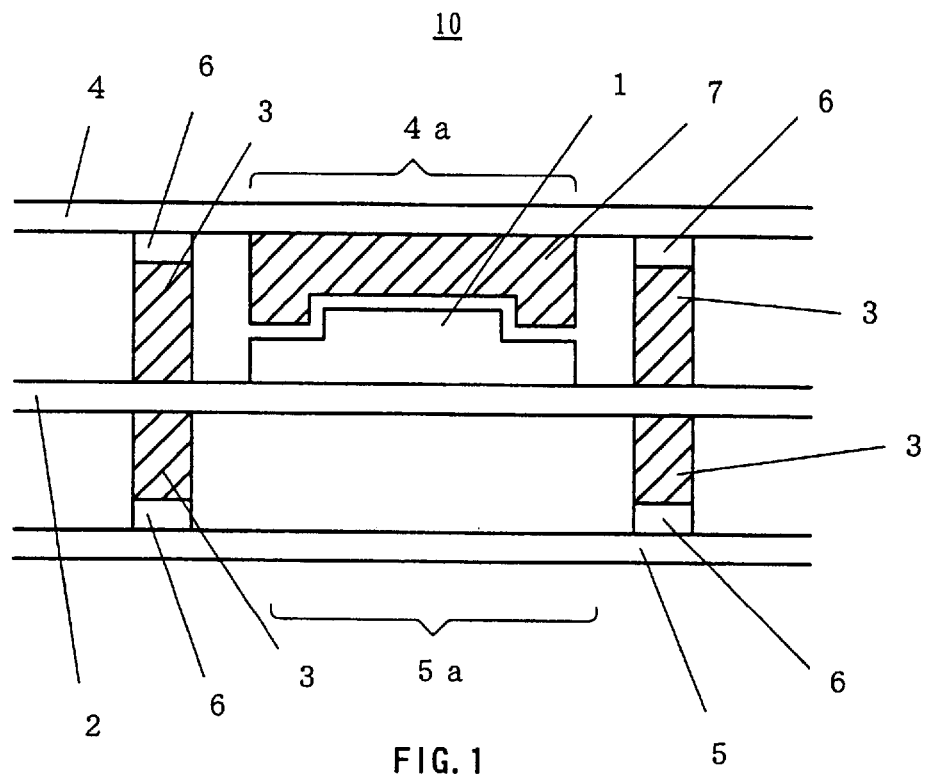
FIG. 1 is a sectional view for explaining an electronic device of this invention.

A description will now be given of the principle of an electronic device 10 of the present invention, with reference to FIG. 1. Hereupon, FIG. 1 is a sectional view for explaining the principle of the electronic device 10 of this invention. The electronic device 10 of this invention includes an electronic component 1, a printed circuit board 2 mounted with the electronic component 1, a spacer 3, and plates 4 and 5.

The electric component 1 includes an LSI device, for example, and is mounted on the printed circuit board 2 such as a motherboard. As described later, the electronic component 1 may be mounted on the front and rear sides of the board, and electronic component 1 does not necessarily need to be a heat source.

In FIG. 1, the spacer 3 is provided around the electronic component 1 almost symmetrically with respect to the board 2. The spacer 3 has a predetermined rigidity, and has been provided, for example, around the board 2 between the board 2 and the plate 5 in order to space the board 2 from the plate 5 by a predetermined distance. However, as the spacer 3 has become shorter in the length direction, the possible flexure amount of the plate 4, for example, when pressure is applied to the plate 4, becomes larger than the distance between the plate 4 and electronic component 1, whereby a collision between the electronic component 1 and the plate 4 can damage of the electronic component 1.

In order to avoid this situation, the present invention places the spacer 3 around the electronic component 1 between the board 2 and the plate 4. Functionally speaking, the present invention uses the spacer 3, which has been provided to secure a clearance, to enhance the rigidities in areas 4a and 5a in the plates 4 and 5 corresponding to the electronic component 1. The spacer arrangement method of the preset invention drastically reduces the flexure amount of each of the plates 4 and 5 in the areas 4a and 5a in comparison with those having the spacer 3 around the board 2 or lacking the spacer 3, and prevents the electronic component 1 or the board 2 from contacting the banding plate 4 and 5. Such an effect may be clearly understood from the electronic device shown in FIG. 4 that utilizes the present invention, in comparison with the conventional electronic device shown in FIG. 3. In FIG. 4, only top surface 212a of housing 210a bends above electronic component 204a between spacers 300 by a small flexure amount without contacting the electronic component 204a, The spacers 300 also indirectly protect electronic components 206a. Elements 208a represent spacers. Board 202a corresponds to board 202, and bottom surface 214a corresponds to bottom surface 214 of FIG. 3.

Turning back to FIG. 1, the spacer 3 instantaneously and diffusely transmits the impact force applied to one of plates 4 and 5 to the other plate. When the plate 4 and/or 5 constitute housing's top and/or bottom of the notebook PC, for example, the spacer 3 enhances the rigidity of the housing and dispenses the housing from being made thick for sufficient rigidity as in the conventional model. Consequently, the configuration of the present invention contributes to a thin and light housing.

The spacer 3 may penetrate the board 2 or be provided at the front and rear sides of the board 2. The spacer 3 may have an arbitrary shape. For example, the spacer 3 may be formed as two or more stainless members having a cylindrical or polygonal column shape, or a doughnut shape surrounding the electronic component 1.

The doughnut-shaped spacer 3 penetrating the board 2 would be formed as one member. Needless to say, the spacer 3 may have a complete, notch or polygonal doughnut shape. Preferably, the spacer 3 is arranged approximately almost symmetrical with respect to the board 2. Such a symmetric structure can prevent a transmission of the pressure applied to one of the plate 4 and 5 to the board 2 so as to bend the board 2.

The spacer 3 penetrating the board 2 would be fixed on the plates 4 and 5 directly or preferably through shock absorber 6 that will be described later. In this case, the board 2 has a hole 203 that matches the section of the pacer 3. On the other hand, two spacers 3 mounted at the both sides of the board 2 may be fixed either on the board 2 or on the plates 4 and 5. Any fixing method known in the art may be applied, and a detailed description thereof will be omitted. The spacer 3 may be made of heat-conductive materials. Thereby, the spacer 3 may radiate the heat from electronic component 1 to the plates 4 and 5. An example of heat-conductive materials include stainless, etc. The spacer 3 made of heat-conductive materials may contact heat-conductive member 7 that will be described later.

Each of the plates 4 and 5 serves as a rigid member. Preferably, the plates 4 and/or 5 themselves may serve to radiate the heat for the electronic component 1 as a heat source, or transmit the heat to any radiator. In the former, for example, the plate 4 may constitute a radiative plate, keyboard's plate or housing in a notebook PC as described later. In the latter, for example, the plate 4 may be formed as a non-radiative plate connected to a heat pipe that passes above the electronic component 1, and the heat pipe is connected to a heat sink (not shown) cooled by a cooling fin (not shown). Thereby, the heat from electronic component 1 is radiated directly on the plate 4, or is transmitted to and radiated by the heat sink. Thus, the plate 4 and/or 5 that serves to radiate the heat in the inventive notebook PC would eliminate the radiative plate that has been provided conventionally between the electronic component 1 and the housing's top surface (e.g., corresponding to the plate 4), making the housing thin and light, by an amount related to the thickness and weight the radiative plate.

The shock absorber (i.e., a vibration absorbing member 6 is provided between the spacer 3 and each of the plates 4 and 5. Optionally, the shock absorber 6 may be placed only around the spacer 3 to entirely cover it or only at a connection part between the spacer 3 and the board 2 while the spacer 3 may be inserted, for example, into the hole 203 in the board 2 through the shock absorber 6. The shock absorber 6 is elastic, and bonded, for example, to both of spacer 3 and each of the plates 4 and 5 with adhesive, etc. The shock absorber 6 absorbs the impact and vibration applied to the plates 4 and 5, and prevents the vibration from transmitting to the electronic component 1 through the board 2 and spacer 3 and destroying the electronic component 1. Such a configuration is especially effective, for example, when the plate 4 or 5 constitutes the keyboard's plate in the notebook PC, because the plate 4 or 5 may absorb continual vibrations and/or impacts from typing of the keyboard. Needless to say, the shock absorber may be omitted when the vibration by plates 4 and/or 5 may be disregarded.

Optionally or additionally, the shock absorber 6 placed between the board 2 and the spacer 3 that does not penetrate the board 2 would achieve the similar effects. For example, the shock absorber 6 located between the spacer 3 and plate 4 may be formed as one (or more) shock absorber that covers the area 4a. Such a configuration is advantageous in that the heat-conductive member 7 that will be described later does not necessarily absorb the shock. The shock absorber 6 made of materials sufficiently softer than the plates 4 and 5 may be generally regarded to have a shock absorbing property.

The heat-conductive member 7 is provided between the electronic component 1 and plate 4. The heat-conductive member 7 is bonded to the area 4a in the plate 4 with adhesive etc., for example. The heat-conductive member 7 that serves as a shock absorber would be able to eliminate the shock absorber 6 or reduce the number shock absorbers 6. The shock-absorbing heat-conductive member 7 prevents, as the above shock absorber, 6, the vibration and impact applied to the plate 4 from transmitting to the electronic component 1, thereby protecting the electronic component 1. Although the heat-conductive member 7 may have any shape, it preferably has the area and solid shape enough to cover the surface of the electronic component 1 as shown in FIG. 1, and transmits to the plate 4 the heat from the electronic component 1 as a heat source. Moreover, as described above, the heat-conductive member 7 may have the shape that contacts the spacer 3. In that case, alternatively, the shock absorber 6 may be placed between the spacer 3 and the heat-conductive member 7 to absorb the vibration. Needless to say, the heat-conductive member 7 may be omitted for the electronic component 1 that does not generate the heat.

Figure 2:
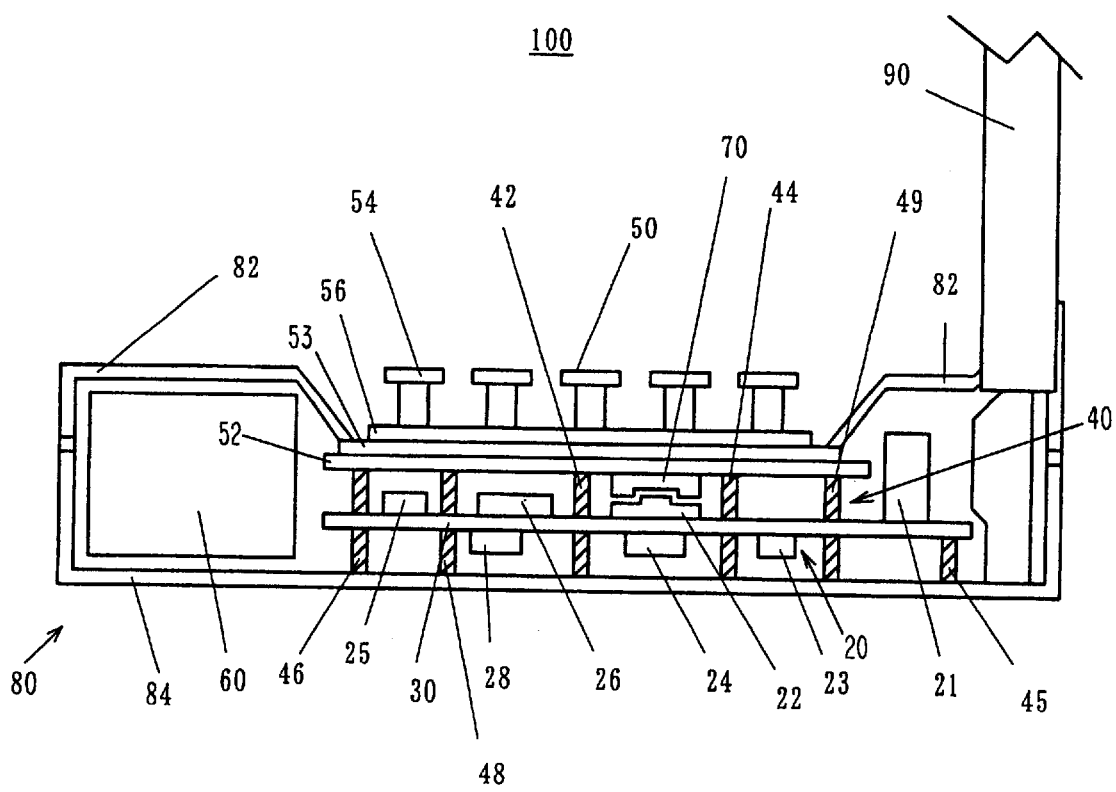
FIG. 2 is a sectional view of a notebook personal computer according to this invention.

A description will next be given of the notebook PC 100 of the present invention with reference to FIG. 2. Hereupon, FIG. 2 is a sectional view is a sectional view of the notebook PC 100 of this invention. The notebook, PC 100 of this invention includes multiple electronic components 21 to 26 and 28 (generalized by reference numeral "20"), a printed circuit board 30, multiple spacers 42, 44, 45, 46, 48 and 49 (generalized by reference numeral "40"), a keyboard 50, a hard disk (drive) 60, a shock-absorbing heat-conductive member 70, a housing 80, and a LCD panel 90. Anything known in the art may be applied to the hard disk 60 and the LCD panel 90.

The electronic component 22 among the multiple electronic components 20 corresponds to the electronic component 1 shown in FIG. 1 and, for example, is a heat source such as an LSI. The other electronic components are not a heat source in this embodiment, but include various kinds of switches and connectors, etc. which are still required to be protected from the external impact and vibration. No spacer 40 that will be described later is provided between the board 30 and top cover 82, because the top cover 82 and/or the electronic component 21 may have the sufficient strength, or the distance between the top cover 82 and the electronic component 21 is bigger than the flexure amount of the top cover 82. However, this does not prohibit an installation of the spacer 40.

The board 30 corresponds to the board 2 shown in FIG. 1, and a detailed description thereof will be omitted. The spacers 42 and 44 each correspond to the 10 spacer 3. The instant embodiment connects the top end of the spacer 40 (other than the spacer 45) to radiative plate 52 for the keyboard 50 that will be described later, and the bottom end thereof is connected to bottom cover 84 of the housing 80 that will be described later. Thus, the instant embodiment facilitates the thin and light PC 100 using the originally provided radiative plate 52 and bottom cover 84 instead of using the plates 4 and 5 as independent members. A use of the radiative plate 52 eliminates the independent radiative plate that has, traditionally been provided, additionally facilitating the thin and light PC 100. Since the bottom cover 84 of the housing 80 also radiates the heat, it is possible to effectively radiate the heat even if electronic component 23, 24 and 28 mounted on the rear surface of the board 30 are heat sources.

In this case, it is preferable to provide the shock-absorbing heat-conductive member 70 to these electronic components similarly or to make the spacer 40 heat-conductive enough to transmit the heat from the electronic components to the bottom cover 84. A plurality of spacers 40 provided in the housing 80 enhance the rigidity of the housing 80, and decrease the flexure amount.

The keyboard 50 has various kinds of keys 54 and board 56 that transmit key information to the above-described electronic components or another electronic component (not shown), and radiative plate 52 is connected to the back of the board 53. As described above, the plate 52 is conventionally provided to radiate the heat generated from the board 53 by typing of the keys 54. In the instant embodiment, the plate 52 also serves as a radiative plate for the electronic component 22. The keyboard 50 has many apertures and may radiate the heat more efficiently than releasing the heat using the housing 80. Reduced or no vibration or impact by the typing of the key 54 is transmitted to the electronic component 20 because the vibration etc. are diffusely transmitted to the bottom cover 84 through the spacer 40 other than the spacer 45. The optionally provided shock absorber 6 shown in FIG. 1 would improve this effect. Similarly, the impact etc. applied the bottom cover 84 are also diffusely transmitted to the plate 52 through the spacer 40.

Figure 3:
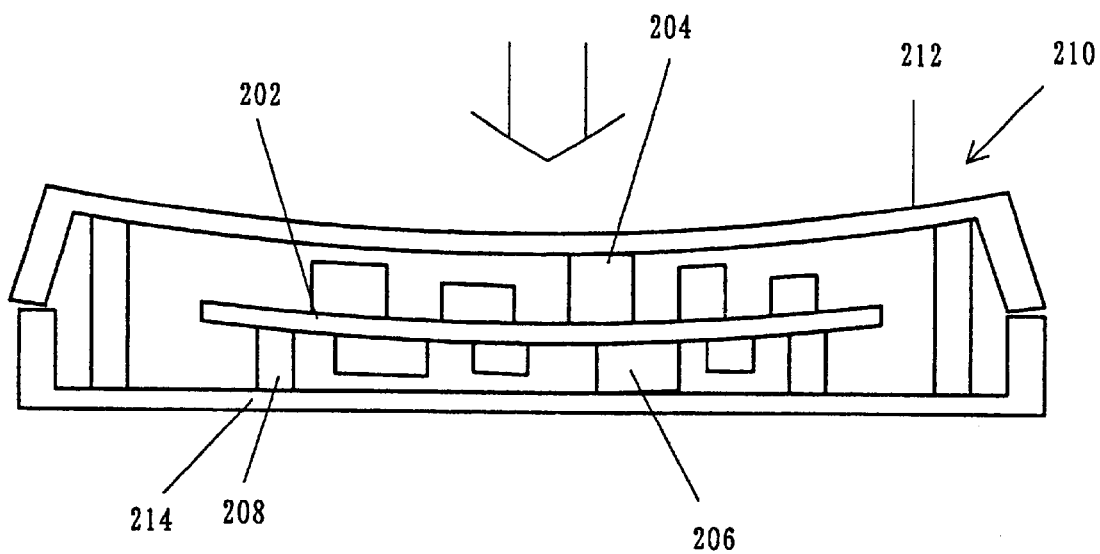
FIG. 3 is a sectional view for explaining problems of a conventional electronic device.
Figure 4:
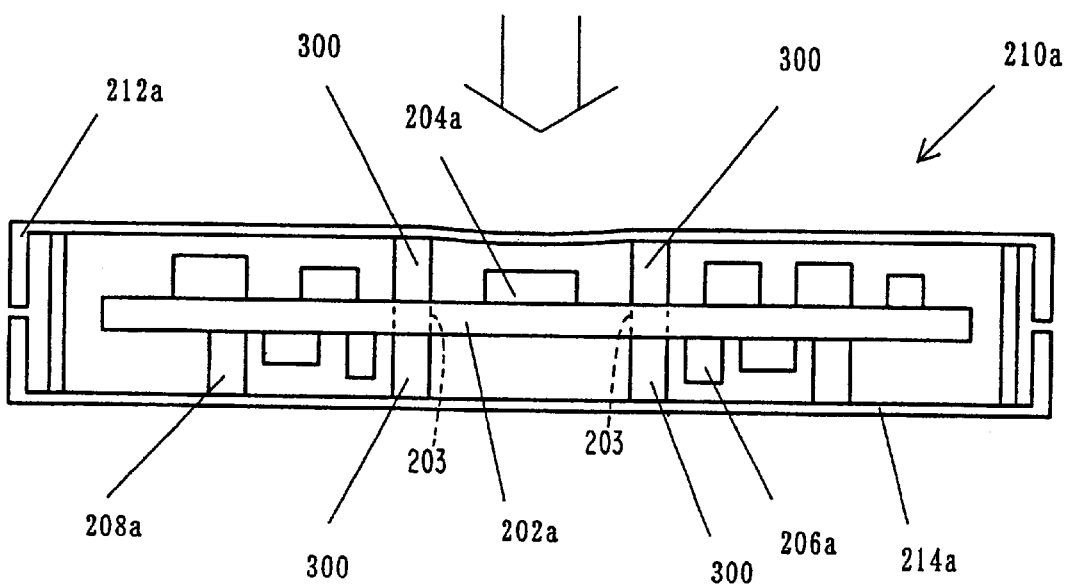
FIG. 4 is a sectional view for explaining effects of the electronic device of this invention in comparison with the electronic device shown in FIG. 3.

The flexure amount of the plate 52 or bottom cover 84 between respective spacers 40 is smaller than that of the conventional structure that includes spacers only at the rear side of the board (see FIG. 3). Therefore, the plate 52 and bottom cover 84 are prevented from contacting or colliding with the electronic components 20. In addition, for example, the electronic components 22 and 26 are prevented from contacting the plate 52, and thereby being destroyed, as a result of the bottom cover 84 contacting the electronic component 24 and bending the board 30 upward together with the electronic component 24.

The shock-absorbing heat-conductive member 70 corresponds to the heat-conductive member 7 shown in FIG. 1. For example, when the electronic component 22 uses an LSI having an almost square pillar shape with a convex portion in the center, the heat-conductive member 70 may have a corresponding, almost square pillar shape with a concave portion in the center. Thus, fitted shapes between the heat-conductive member 70 and the electronic component 22 would realize an efficient heat radiation (or heat transmission).

The housing 80 has the top cover 82 and the bottom cover 84. The top surface of the LCD panel 90 may be considered as a part of the housing 80.

Further, the preferred embodiments of the present invention have been explained, but variations and modifications may be made without departing from the scope of the present invention. For example, the present invention is not limited to electronic devices, but is generally applicable to an apparatus that has magnetic, optical, electric components required to be protected from the vibration and impact.

According to the electronic devices of the present invention, the flexure amount of the rigid member that may occur around the electronic component becomes small by the spacer that is placed around the electronic component, as shown in FIG. 4. This reduces the risk that the rigid member will collide with the electronic component. The spacer easily enhances the rigidity of the rigid member, and facilitates a thinner and lighter body, in comparison with the conventional one that enhances the rigidity using a thick rigid member. In addition, for example, if the spacer exists only between the rear side of the board and the bottom rigid member as shown in FIG. 3, the pressure applied to the top rigid member may bend the board, distort any electronic component provided at the rear side of the board, and consequently cause the electronic component at the rear side of the board to collide with the bottom rigid member. In contrast, according to the present invention, as shown in FIG. 4, the spacer prevents the board from bending, and prevents the electronic component at the rear side of the board from colliding, with the bottom rigid member. The impact applied to the rigid member is diffusely transmitted to the rigid member at the opposite side with respect to the board through the spacer, thereby reducing or eliminating the impact received by the electronic component. The rigid member that constitutes the housing that contains the electronic component, the board and the spacer would realize a thinner and lighter body than the configuration that has the rigid member and housing independently.

A shock absorber provided between the spacer and rigid member and/or between the spacer and board would absorb the vibration applied to the rigid member without allowing the vibration to transmit to the electronic component. This prevents the electronic component from being damaged by the vibration. A heat-conductive member provided between the electronic component and rigid member would radiate the heat from the electronic component more efficiently by transmitting it to the rigid member. The heat-conductive member is placed in the originally existing aperture between the electronic component and rigid member, and thus does not prevent the 1 electronic device from being made thin, unlike the conventional radiative plate. A shock-absorbing heat-conductive member would absorb the vibration applied to the rigid member without allowing it to transmit to the electronic component. This prevents the electronic component from being damaged by the vibration.

The notebook PC of the present invention may enhance housing's rigidity around the electronic component as a heat source such as an LSI. This prevents the housing from being bent and the electronic component from being damaged by the collision with the housing. The notebook PC of the present invention may easily and inexpensively realize a thinner and lighter body than the conventional model because the housing serves to radiate the heat as performed by the conventionally required radiative plate.

The device according to the present invention uses the spacer and easily protects the components including electric, electronic, magnetic and optical elements that require to be protected from the vibration and impact.

What is claimed is:

1. An electronic device comprising:
   an electronic component;
   a board having a first surface and a second opposite surface and being mounted with said electronic component;
   a first spacer located on said first surface of said board near said electronic component;
   a second spacer located on said second surface of said board near said electronic component;
   a third spacer located on one of said first and second surfaces of said board;
   a first rigid member connected to said first and third spacers; and
   a second rigid member connected to said second spacer,
   wherein said first and second spacers protect said electronic component from colliding with the second rigid member, and the third spacer supports said board above the first rigid member.

2. An electronic device according to claim 1, wherein said first and second spacers are connected at a hole which penetrates said board near said electronic component.

3. An electronic device according to claim 1, wherein at least one of said first and second rigid members is a radiative plate.

4. An electronic device according to claim 1, wherein said first and second rigid members form a housing for said electronic component, said board, and said spacers.

5. An electronic device according to claim 1, wherein said electronic device is a portable computer and further includes a keyboard including a radiative plate, and said first rigid member is said radiative plate of said keyboard.

6. An electronic device according to claim 1, further comprising a shock absorber located between at least one of said first and second spacers and at least one of said first and second rigid members, respectively.

7. An electronic device according to claim 1, further comprising a shock absorber located between at least one of said first and second spacers and said board.

8. An electronic device according to claim 1, further comprising a heat-conductive member located between said electronic component and at least one of said first and second rigid members so that said heat-conductive member can transfer heat to said at least one of first and second rigid members.

9. An electronic device according to claim 8, wherein said heat-conductive member absorbs vibration.

10. An electronic device according to claim 1, wherein at least one of said first and second spacers is made of a heat-conductive material and transfers heat to said first and second rigid members.

11. An electronic device according to claim 1, wherein at least one of said first and second spacers is substantially annular.

12. An apparatus comprising:

a component;

a board having a first surface and a second opposite surface and being mounted with said component;

a first spacer located on said first surface of said board near said component;

a second spacer located on said second surface of said board near said component;

a third spacer located on one of said first and second surfaces of said board;

a first rigid member connected to said first and third spacers; and a second rigid member connected to said second spacer;

wherein said first and second spacers prevent said component from contacting the second rigid member, and the third spacer supports said board above the first rigid member.

13. An apparatus according to claim 12, wherein said component includes an element selected from a group consisting of an electric element, an electronic element, a magnetic element, an optical element, and a combination thereof.

* * * * *